(12) United States Patent
Al Omari et al.

(10) Patent No.: US 11,732,982 B2
(45) Date of Patent: *Aug. 22, 2023

(54) HEAT SINKS WITH VIBRATION ENHANCED HEAT TRANSFER

(71) Applicant: UNITED ARAB EMIRATES UNIVERSITY, Al Ain (AE)

(72) Inventors: Salah Addin Burhan Al Omari, Al Ain (AE); Emad Elnajjar, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 163 days.

This patent is subject to a terminal disclaimer.

(21) Appl. No.: 17/090,736

(22) Filed: Nov. 5, 2020

(65) Prior Publication Data

US 2021/0055065 A1 Feb. 25, 2021

Related U.S. Application Data

(63) Continuation of application No. 16/664,504, filed on Oct. 25, 2019, now Pat. No. 10,890,387.

(Continued)

(51) Int. Cl.
*F28F 13/10* (2006.01)
*F28D 21/00* (2006.01)
(Continued)

(52) U.S. Cl.
CPC ............. *F28F 13/10* (2013.01); *F28D 21/00* (2013.01); *H01L 23/427* (2013.01); *H01L 23/433* (2013.01); *F28D 2021/0029* (2013.01)

(58) Field of Classification Search
CPC ........... F28F 9/013; F28F 13/10; H01L 23/36; H01L 23/427; H01L 23/433
See application file for complete search history.

(56) References Cited

U.S. PATENT DOCUMENTS 6,665,186 B1 12/2003 Calmidi
6,672,370 B2 1/2004 Searls
(Continued)

FOREIGN PATENT DOCUMENTS

CN 2438083 Y 7/2001
CN 2829313 Y 10/2006
(Continued)

OTHER PUBLICATIONS

International Search Report and Written Opinion dated Mach 2, 2021 in application PCT/IB2020/059980.

(Continued)

*Primary Examiner* — Paul Alvare
(74) *Attorney, Agent, or Firm* — Nath, Goldberg & Meyer; Richard C. Litman

(57) ABSTRACT

The heat sinks with vibration enhanced heat transfer are heat sinks formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be a liquid heat source, including but not limited to water. The thermally conductive housing is disposed such that at least one contact face of the thermally conductive housing is in direct contact with the vibrating base. The vibrating base applies oscillating waves to the heat sink, thereby increasing heat transfer between the heat source and the heat sink.

14 Claims, 6 Drawing Sheets

Related U.S. Application Data

(60) Provisional application No. 62/750,796, filed on Oct. 25, 2018.

(51) Int. Cl.
  *H01L 23/427* (2006.01)
  *H01L 23/433* (2006.01)

(56) References Cited

U.S. PATENT DOCUMENTS

| | | | |
|---|---|---|---|
| 9,000,473 | B2 | 4/2015 | Lee |
| 10,043,732 | B1 | 8/2018 | Al Omari |
| 2002/0033247 | A1 | 3/2002 | Neuschutz |
| 2005/0093140 | A1 | 5/2005 | Kim |
| 2005/0228097 | A1 | 10/2005 | Zhong |
| 2006/0238984 | A1 | 10/2006 | Belady |
| 2007/0058346 | A1 | 3/2007 | Yeh |
| 2008/0041565 | A1 | 2/2008 | Yang |
| 2008/0101073 | A1 | 5/2008 | Hayman |
| 2011/0083436 | A1* | 4/2011 | White .................... F28D 20/02 165/104.19 |
| 2013/0285233 | A1 | 10/2013 | Bao et al. |
| 2015/0033764 | A1 | 2/2015 | Gurevich |
| 2015/0204612 | A1 | 6/2015 | Sun |
| 2015/0285564 | A1 | 10/2015 | Wood |
| 2016/0212878 | A1 | 7/2016 | Quinn |
| 2016/0223269 | A1 | 8/2016 | Hartmann et al. |
| 2018/0063995 | A1 | 3/2018 | Lin |

FOREIGN PATENT DOCUMENTS

| | | |
|---|---|---|
| CN | 101775270 A | 7/2010 |
| CN | 103759563 A | 4/2014 |
| CN | 104344289 A | 2/2015 |
| JP | 2008210875 A | 9/2008 |
| JP | 2008210876 A | 9/2008 |
| KR | 20030029071 A | 4/2003 |
| KR | 20050039436 A | 4/2005 |
| KR | 20130037868 A | 4/2013 |
| KR | 20130125060 A | 11/2013 |

OTHER PUBLICATIONS

Gao, Y. and Liu, J., "Gallium-based thermal interface material with high compliance and wettability." Applied Physics A 107(3): pp. 701-708 (2012).

Song, S., et al. "Experimental study on laminar convective heat transfer of microencapsulated phase change material slurry using liquid metal with low melting point as carrying fluid." International Journal of Heat and Mass Transfer 73: pp. 21-28 (2014).

Zaghdoudi, M. C., "Use of Heat Pipe Cooling Systems in the Electronics Industry," Electronics Cooling, (Nov. 1, 2004).

Ghazal, M. S. A., "Experimental Investigations of Techniques to Enhance the Cooling Rate of Hot Fluids By Utilizing Gallium as a Heat Sink Material," Mechanical Engineering Theses 2, United Arab Emirates University (Nov. 2017).

* cited by examiner

HEAT SINKS WITH VIBRATION ENHANCED HEAT TRANSFER

CROSS-REFERENCE TO RELATED APPLICATION

This application is a continuation of Ser. No. 16/664,504, filed Oct. 25, 2019, which application claims the benefit of U.S. Provisional Patent Application Ser. No. 62/750,796, filed Oct. 25, 2018.

BACKGROUND

1. Field

The disclosure of the present patent application relates to heat sinks, and particularly to a heat sink with vibration enhanced heat transfer.

2. Description of the Related Art

As electronic technology continues to advance, electronic components, such as processor chips, are being made to provide faster operational speeds and greater functional capabilities. When a typical processor chip or a similar integrated circuit or modular circuit package operates at a high speed inside a computer or device housing, its temperature increases at a rapid rate. It is therefore necessary to dissipate the generated heat before any damage to the system may occur.

Conventionally, a heat sink is used to dissipate heat generated by a processor or the like. A conventional heat sink includes a base, which makes direct contact with the heat source, and a plurality of cooling fins. The heat sink dissipates heat by conduction through the base and into the fins, followed by convective cooling of the fins. However, as the power of electronic devices increases, so does the heat generated by their internal components, thus requiring heat sinks that are capable of dissipating heat far more effectively. For this reason, liquid cooling systems were developed to provide more efficient heat removal.

Vibration has also been used to enhance certain characteristics of conventional heat sinks and heat spreaders. For example, an LED module including a heat sink with a vibrating fin has been taught to improve cooling performance. Conventionally, a heat spreader is generally used to rapidly disperse heat across an area, and may be used in combination with a heat sink. A heat spreader including a liquid filled internal space between two thin films and a vibration means for vibrating the liquid have been taught to improve heat spread performance.

Although such phase change material-type heat sinks and/or vibration enhanced heat sinks/spreaders are more efficient than conventional heat sinks/spreaders, these heat sinks/spreaders are still limited in their effectiveness. A typical water-based phase change material-type heat sink, as described above, is limited in its effectiveness primarily due to design considerations, such as thermal conductivity and heat capacity of the materials involved as functions of the physical dimensions of the heat sink. The heat sinks/spreaders incorporating vibration are also limited by design considerations, specifically in that the vibration is applied to cooling fins or to increase the rate at which the heat is dispersed in a liquid reservoir. Thus, heat sinks with vibration enhanced heat transfer solving the aforementioned problems are desired.

SUMMARY

In one embodiment, the present subject matter is directed to a heat sink with a vibrating base. In this embodiment, the heat sink is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be any liquid heat source, including but not limited to a hot immiscible liquid. The thermally conductive housing has at least one wall and is disposed such that at least one contact face of the thermally conductive housing is in direct contact with the vibrating base.

In use, heat generated by the heat source is transferred, via conduction, into the first body of high thermal conductivity material. The heat from the heat source may cause at least a portion of the first body of high thermal conductivity material, if solid, to at least partially liquefy, forming a conductive melted high thermal conductivity material layer within the first body of high thermal conductivity material and disposed in direct contact with the heat source. In this embodiment, the material chosen to form the first body of high thermal conductivity material is selected such that the conductive melted high thermal conductivity material layer is immiscible with the hot immiscible liquid heat source.

In another embodiment, the first body of high thermal conductivity material may be a liquid material disposed in direct contact with the heat source. In this embodiment, the liquid material chosen as the first body of high thermal conductivity material is immiscible with the hot immiscible liquid heat source. Other liquid materials that would mix with the hot immiscible liquid heat source cannot be used as the first body of high thermal conductivity material.

The first body of high thermal conductivity material will thus absorb and store latent and sensible heat until it can be transferred by convection through the thermally conductive housing and be dissipated into the surrounding environment. The vibrating base may apply oscillating waves, propagating through the thermally conductive housing and/or the first body of high thermal conductivity material, to reach the direct contact interface and thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. At the direct contact interface, the vibration may generate active dynamic motions of the molecules of the first body of high thermal conductivity material, the conductive melted high thermal conductivity material layer, or the heat source thereby dilating the direct contact interface, increasing the surface area of contact between the heat source and the first body of high thermal conductivity material or the conductive melted high thermal conductivity material layer, and further increasing the rate of heat transfer from the heat source to the heat sink.

In an embodiment, the heat source requiring cooling may be a hot immiscible liquid.

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
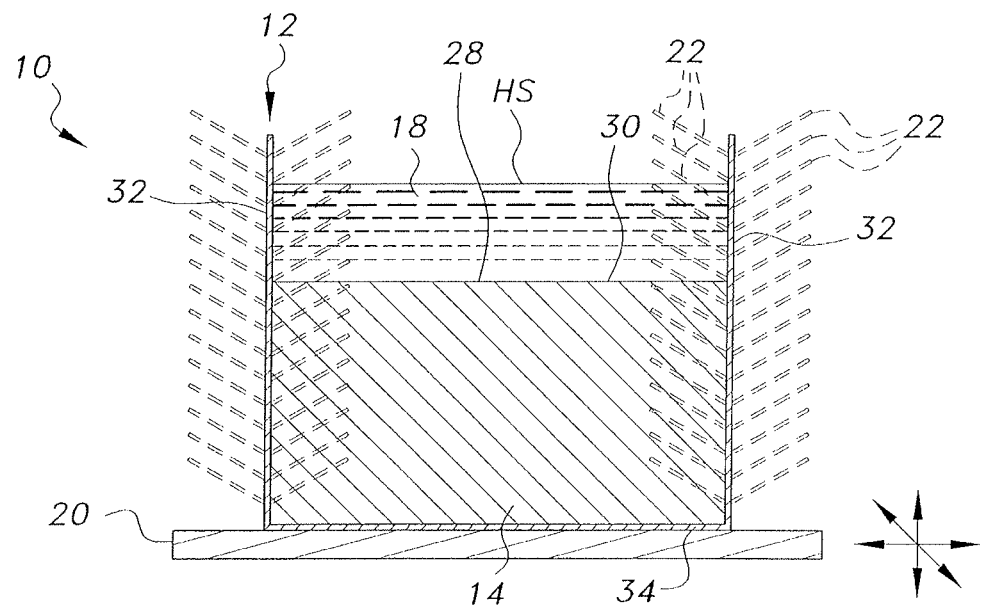
FIG. 1A is a side view in section of an alternative embodiment of a heat sink with vibration enhanced heat transfer adapted for cooling of a hot immiscible liquid heat source.

The heat sink with vibrating base is formed from a first body of high thermal conductivity material. The first body of high thermal conductivity material is received within a thermally conductive housing such that at least one contact face of the first body of high thermal conductivity material is exposed, forming a direct contact interface with a heat source requiring cooling. The heat source requiring cooling may be any liquid heat source, including but not limited to a hot immiscible liquid. The thermally conductive housing has at least one wall and is disposed such that at least one contact face of the thermally conductive housing is in direct contact with the vibrating base. The high thermal conductivity material may be a liquid material or a solid material. Thus, part or all of the first body of high thermal conductivity material may be liquefied prior to exposing the heat sink to the heat source. The at least one wall of the thermally conductive housing may have a plurality of fins mounted to at least a portion thereof, either outside or inside of the first body of solid high thermal conductivity material. The individual fins forming the plurality of fins may have any orientation, may be straight or branched, may be solid or hollow, and/or may have any combination of these features.

As used herein, the term "approximately" when used to modify a numerical value means within 10% of said numerical value.

In use, heat generated by the heat source is transferred, via conduction, into the first body of high thermal conductivity material. The heat from the heat source may cause at least a portion of the first body of high thermal conductivity material, if solid, to at least partially liquefy, forming a conductive melted high thermal conductivity material layer within the first body of high thermal conductivity material and disposed in direct contact with the heat source. The conductive melted high thermal conductivity material layer may act as a liquid with a high thermal conductivity, thereby supporting heat transfer from the heat source to the conductive melted high thermal conductivity material layer and subsequently to the rest of the first body of high thermal conductivity material. Heat transfer via the conductive melted high thermal conductivity material layer may occur via conduction and convection. The conductive melted high thermal conductivity material layer may transfer heat between the heat source and the first body of high thermal conductivity material and/or the thermally conductive housing by conduction or convection. The first body of high thermal conductivity material will thus absorb and store latent and sensible heat until it can be transferred by convection through the thermally conductive housing and be dissipated into the surrounding environment.

The vibrating base may be made of any suitable material; however, it is preferably made of a material with a high thermal conductivity, such as, by way of non-limiting example, aluminum. The vibrating base may apply oscillating waves, propagating through the thermally conductive housing and/or the first body of high thermal conductivity material, to reach the direct contact interface between the first body of high thermal conductivity material and the heat source requiring cooling, thereby increasing heat transfer between the heat source and the first body of high thermal conductivity material, and/or between the heat source and the conductive melted high thermal conductivity material layer, and/or between the conductive melted high thermal conductivity material layer and the rest of the first body of high thermal conductivity material. The oscillating waves can be any kind of wave, including for example sinusoidal waves or square waves. The oscillating waves may be applied laterally, vertically, or in any other direction. The oscillating waves may be generated by any known means, including but not limited to mechanical means, ultrasound, and electrical or magnetic effects.

At the direct contact interface, the oscillating waves (vibrations) may generate active dynamic motions of the molecules of the first body of high thermal conductivity material and/or the conductive melted high thermal conductivity material layer, thereby increasing the rate of heat transfer from the heat source to the heat sink. The vibrations may also dilate the direct contact interface, increasing the surface area of contact between the heat source and the first body of high thermal conductivity material or the conductive melted high thermal conductivity material layer, further increasing the rate of heat transfer from the heat source to the heat sink.

The heat source may be any liquid that is immiscible in the liquid form of the first body of high thermal conductivity material, i.e., when a portion of the first body of a solid high thermal conductivity material forms the conductive melted high thermal conductivity material layer or when the high thermal conductivity material is a liquid material. As a non-limiting example, the heat source may be water, an oil, or dielectric liquid, where the ~~selected high thermal conductivity material~~ has a density that is less than the density of the first body of high thermal conductivity material. The vibrations may be applied directly to the heat sink and propagated through the first body of high thermal conductivity material.

Figure 1B:
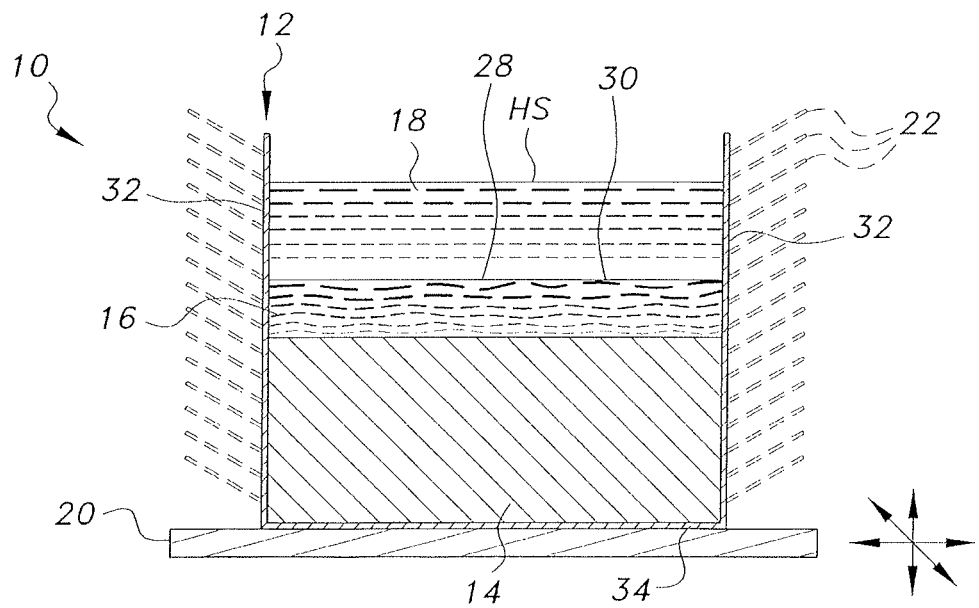
FIG. 1B is a side view in section of an alternative embodiment of a heat sink with vibration enhanced heat transfer adapted for cooling of a hot immiscible liquid heat source and having a conductive melted high thermal conductivity material layer.

In the embodiment of FIGS. 1A and 1B, the heat sink with vibration enhanced heat transfer, designated generally as 10, is again a heat sink formed from a first body of high thermal conductivity material 14 disposed within a thermally conductive housing 12 such that at least one contact face 30 of the first body of high thermal conductivity material 14 is exposed, forming a direct contact interface 28 with at least one face of at least one heat source HS that requires cooling. Similar to previous embodiments, the thermally conductive housing 12 has at least one wall 32 and at least one contact face 34, and said contact face 34 of said thermally conductive housing 12 is adapted to be in direct contact with a vibrating base 20. In this embodiment the heat source HS is an immiscible liquid 18. It should be further understood that the overall configuration and relative dimensions of the thermally conductive housing 12, the first body of high thermal conductivity material 14, and the vibrating base 20 are shown for purposes of illustration only.

The thermally conductive housing 12 may be selected from any suitable material that is compatible with the selected first body of high thermal conductivity material 14. For example, aluminum would not be used as a thermally conductive housing 12 material when the first body of high thermal conductivity material 14 includes elemental gallium. The at least one wall 32 of the thermally conductive housing 12 may have a plurality of fins 22 mounted to at least a portion thereof, either outside or inside of the first body of high thermal conductivity material 14. It should be understood that the positioning, overall configuration, relative dimensions, and number of thermally conductive fins 22 are shown for exemplary purposes only.

The first body of high thermal conductivity material 14 may be formed from at least one high thermal conductivity material. The at least one high thermal conductivity material may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 10 is intended to operate and the maximum operating temperature of the heat source HS. As a non-limiting example, if a heat sink 10 is intended to operate in a room maintained at 20° C. and to cool a heat source with a maximum operating temperature of 60° C., elemental gallium having a melting point of approximately 30° C. might be selected for the first body of high thermal conductivity material 14. If the at least one high thermal conductivity material is a liquid under the intended operating conditions and the heat source is a liquid, the selected material may have a higher density than the density of the heat source material. In the embodiment of FIGS. 1A and 1B, the at least one high thermal conductivity material forming the first body of high thermal conductivity material 14 is also selected such that the immiscible liquid 18 will be immiscible with any liquid or melted portion of the first body of high thermal conductivity material 14 that may form during use of the heat sink 10. Non-limiting examples of suitable high thermal conductivity materials for the first body of high thermal conductivity material 14 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In use, heat generated by the heat source HS is transferred by conduction, into the first body of high thermal conductivity material 14. In the embodiments where the high thermal conductivity material is a solid phase change material, this may result in melting of at least a portion of the first body of high thermal conductivity material 14, which absorbs some of the heat from the heat source and forms a conductive melted high thermal conductivity material layer 16 within the first body of high thermal conductivity material 14 and disposed in direct contact with the heat source HS (as shown in FIG. 1B). Therefore, the conductive melted high thermal conductivity material layer 16 is typically an at least partially liquid form of the first body of high thermal conductivity material 14. In embodiments where the high thermal conductivity material is a liquid, the first body of high thermal conductivity material 14 is immediately adjacent to the heat source HS (as shown in FIG. 1A).

The heat stored in the first body of high thermal conductivity material 14 and the heat stored in the conductive melted high thermal conductivity material layer 16, if present, may then be transferred by conduction and convection, respectively, to the thermally conductive housing 12. Heat transferred to the thermally conductive housing 12 may then be transferred by convection into the external environment, and by convection through the fins 22, if present, thereby cooling the heat sink 10. The vibrating base 20 may propagate oscillating waves through the thermally conductive housing 12, the first body of high thermal conductivity material 14, and/or the thermally conductive melted high thermal conductivity material layer 16, if present, to reach the direct contact interface 28, generating active dynamic molecular motion and dilating the direct contact interface 28, and thereby increasing the rate of heat transfer from the heat source HS to the first body of high thermal conductivity material 14 and the conductive melted high thermal conductivity material layer 16, if present. Thus the heat from the heat source HS is quickly and efficiently transferred to the ambient environment.

Figure 2A:
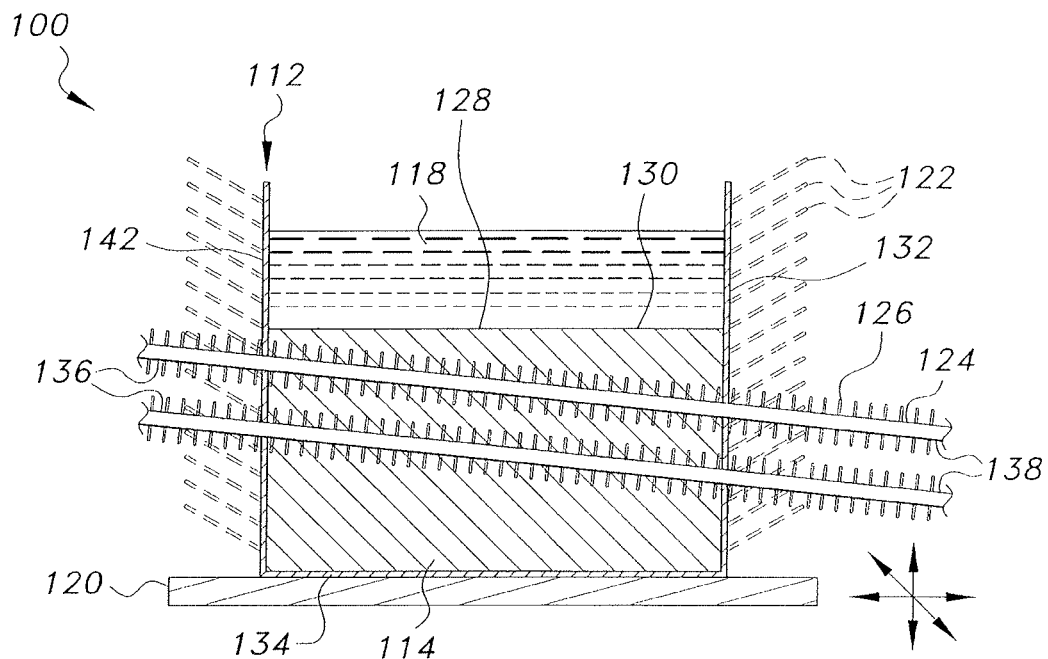
FIG. 2A is a side view in section of an alternative embodiment of a heat sink with vibration enhanced heat transfer adapted for cooling of a hot immiscible liquid heat source having at least one tube.
Figure 2B:
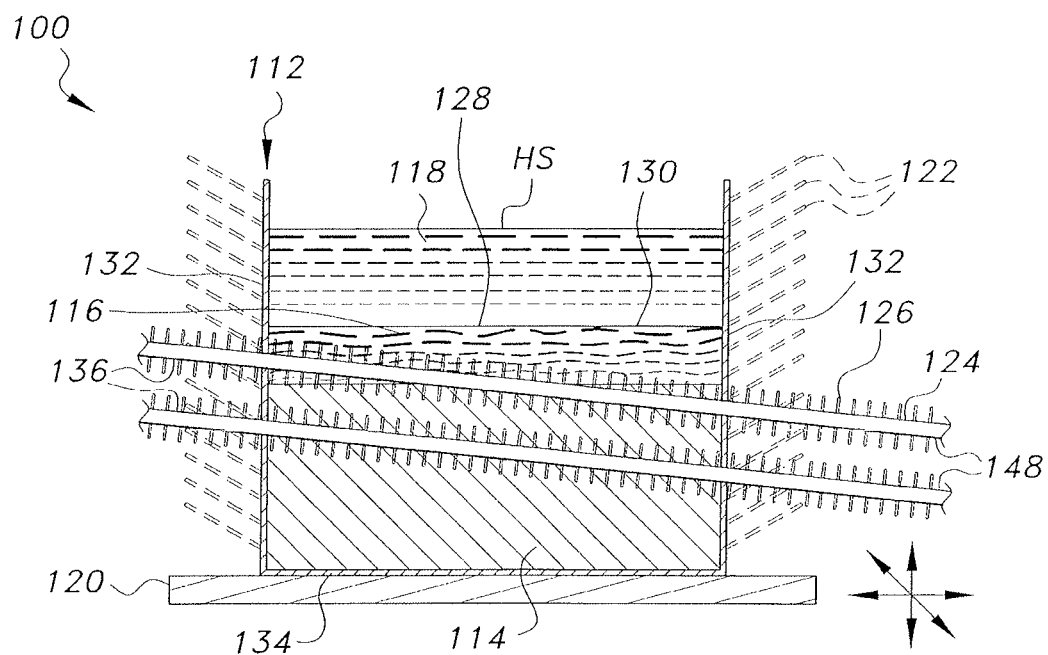
FIG. 2B is a side view in section of an alternative embodiment of a heat sink with vibration enhanced heat transfer adapted for cooling of a hot immiscible liquid heat source having at least one tube and a conductive high thermal conductivity material layer.

In the alternative embodiment of FIGS. 2A and 2B, the heat sink with vibration enhanced heat transfer, designated generally as 100, is also a heat sink formed from a first body of high thermal conductivity material 114 disposed within a thermally conductive housing 112 such that at least one contact face 130 of the first body of high thermal conductivity material 114 is exposed, forming a direct contact interface 128 with at least one face of at least one heat source HS that requires cooling. The thermally conductive housing 112 again has at least one wall 132 and at least one contact face 134, and said contact face 134 of said thermally conductive housing 112 is adapted to be in direct contact with a vibrating base 120. In this alternative embodiment, the heat source HS is an immiscible liquid 118. As in the previous embodiment, it should be further understood that the overall configuration and relative dimensions of the thermally conductive housing 112, the first body of high thermal conductivity material 114, and the vibrating base 120 are shown for purposes of illustration only.

The thermally conductive housing 112 may be selected from any suitable material that is compatible with the selected first body of high thermal conductivity material 114. For example, aluminum would not be used as a thermally conductive housing 112 material when the first body of high thermal conductivity material 114 includes elemental gallium. The at least one wall 132 of the thermally conductive housing 112 may have a plurality of fins 122 mounted to at least a portion thereof, either outside or inside of the first body of high thermal conductivity material 114. It should be understood that the positioning, overall configuration, relative dimensions, and number of thermally conductive fins 122 are shown for exemplary purposes only.

The first body of high thermal conductivity material 114 may be formed from at least one high thermal conductivity material. The at least one high thermal conductivity material may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 100 is intended to operate and the maximum operating temperature of the heat source HS. As a non-limiting example, if a heat sink 100 is intended to operate in a room maintained at 20° C. and to cool a heat source with a maximum operating temperature of 60° C., elemental gallium having a melting point of approximately 30° C. might be selected for the first body of high thermal conductivity material 114. If the at least one high thermal conductivity material is a liquid under the intended operating conditions and the heat source is a liquid, the selected material may have a higher density than the density of the heat source material. In the alternative embodiment of FIGS. 2A and 2B, the at least one high thermal conductivity material forming the first body of high thermal conductivity material 114 is also selected such that the immiscible liquid 118 will be immiscible with any liquid or melted portion of the first body of high thermal conductivity material 114 that may form during use of the heat sink 100. Non-limiting examples of suitable high thermal conductivity materials for the first body of high thermal conductivity material 114 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In use, heat generated by the heat source HS is transferred, via conduction, into the first body of high thermal conductivity material 114. In embodiments where the high thermal conductivity material is a solid phase change material, this may result in melting of at least a portion of the first body of high thermal conductivity material 114, which absorbs some of the heat from the heat source HS and forms a conductive melted high thermal conductivity material layer 116 within the first body of high thermal conductivity material 114 and disposed in direct contact with the heat source HS (as shown in FIG. 2B). Therefore, the conductive melted high thermal conductivity material layer 116 is typically an at least partially liquid form of the first body of high thermal conductivity material 114. In embodiments where the high thermal conductivity material is a liquid, the first body of high thermal conductivity material 114 is immediately adjacent to the heat source HS (as shown in FIG. 2A).

The heat stored in the first body of high thermal conductivity material 114 and the heat stored in the conductive melted high thermal conductivity material layer 116, if present, may then be transferred by conduction and convection, respectively, to the thermally conductive housing 112. Heat transferred to the thermally conductive housing 112 may then be transferred by convection into the external environment, and by convection through the fins 122, if present, thereby cooling the heat sink 100. The vibrating base 120 may propagate oscillating waves through the thermally conductive housing 112, the first body of high thermal conductivity material 114, and/or the thermally conductive melted high thermal conductivity material layer 116, if present, to reach the direct contact interface 128, generating active dynamic molecular motion and dilating the direct contact interface 128, and thereby increasing the rate of heat transfer from the heat source HS to the first body of high thermal conductivity material 114 and the conductive melted high thermal conductivity material layer 116, if present. Thus the heat from the heat source HS is quickly and efficiently transferred to the ambient environment.

In the alternative embodiment of FIGS. 2A and 2B, a plurality of tubes 124 is provided. In the example of FIGS. 2A and 2B, two such tubes 124 are shown, each having a first end 136 and an opposed second end 138; however, it should be understood that any number of tubes 124 may be used. Each of the plurality of tubes 124 is positioned in and traverses the first body of high thermal conductivity material 114 and the thermally conductive housing 112, such that the first end 136 and the second end 138 of each of the plurality of tubes 124 is positioned outside of the first body of high thermal conductivity material 114 and the thermally conductive housing 112. As shown in FIG. 2B, one or more of the plurality of tubes 124 may also traverse at least a portion of the conductive melted high thermal conductivity material layer 116 and/or at least a portion of the immiscible liquid HS. In an embodiment, the first end 136 and the second end 138 of one or more of the plurality of tubes 124 are closed. In an alternative embodiment, the first end 136 and the second end 138 of one or more of the plurality of tubes 124 are in open fluid communication with the external environment. In the alternative embodiment of FIGS. 2A and 2B, each of the plurality of tubes 124 may have a plurality of thermally conductive fines 126 mounted on at least a portion thereof inside and/or outside the first body of high thermal conductivity material 114, the conductive melted high thermal conductivity material layer 116, the immiscible liquid HS, and the thermally conductive housing 112. The plurality of tubes 124 may further improve the rate at which the heat sink 100 transfers heat from the heat source HS to the external environment by providing a large surface area for conduction of heat from the first body of high thermal conductivity material 114 and/or the conductive melted high thermal conductivity material layer 116.

Figure 3A:
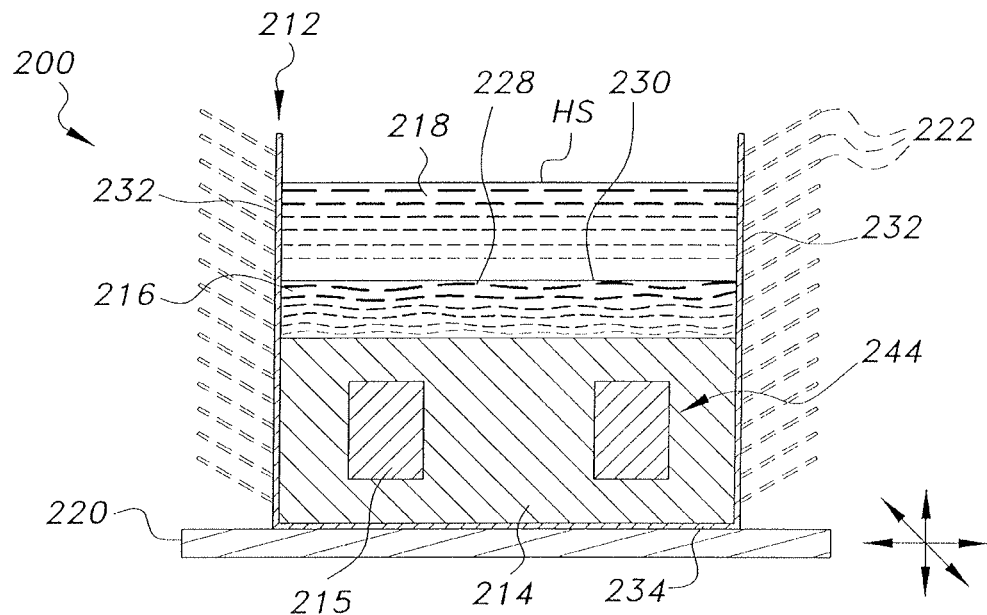
FIG. 3A is a side view in section of an alternative embodiment of a heat sink with vibration enhanced heat transfer adapted for cooling of a hot immiscible liquid heat source having at least one internal chamber for a second body of high thermal conductivity material and a conductive melted high thermal conductivity material layer.
Figure 3B:
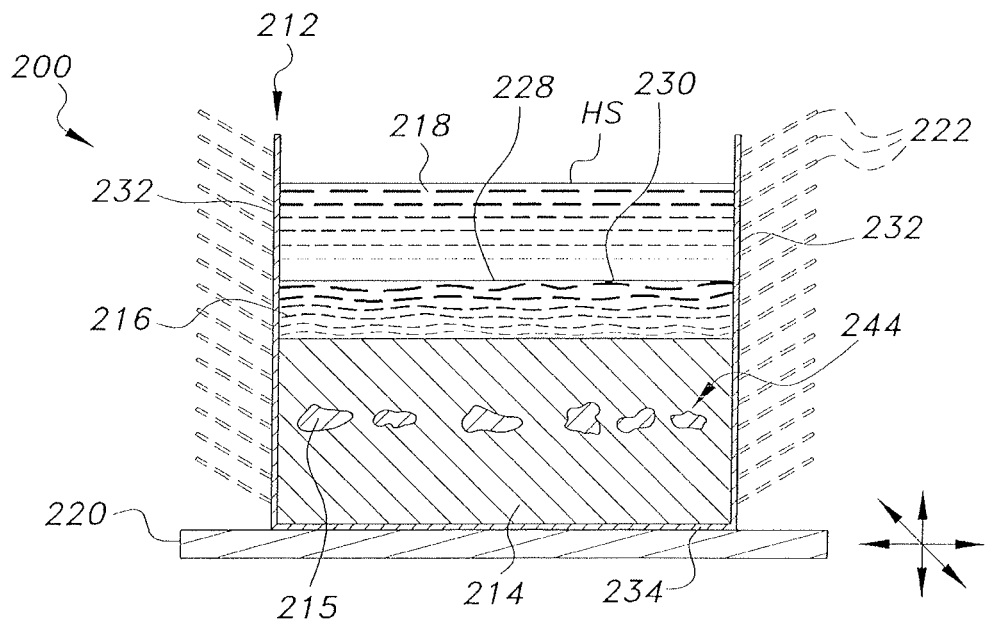
FIG. 3B is a side view in section of an alternative embodiment of a heat sink with vibration enhanced heat transfer adapted for cooling of a hot immiscible liquid heat source having at least one internal chamber for a second body of high thermal conductivity material and a conductive melted high thermal conductivity material layer.

In the alternative embodiment of FIGS. 3A and 3B, the heat sink with vibration enhanced heat transfer, designated generally as 200, is a heat sink formed from a first body of high thermal conductivity material 214 disposed within a thermally conductive housing 212 such that at least one contact face 230 of the first body of high thermal conductivity material 214 is exposed, forming a direct contact interface 228 with at least one face of at least one heat source HS that requires cooling. The thermally conductive housing 212 has at least one wall 232 and at least one contact face 234, and said contact face 234 of said thermally conductive housing 212 is adapted to be in direct contact with a vibrating base 220. In this alternative embodiment, the heat source HS is an immiscible liquid 218. It should be further understood that the overall configuration and relative dimensions of the thermally conductive housing 212, the first body of high thermal conductivity material 214, and the vibrating base 220 are shown for purposes of illustration only.

In the alternative embodiment of FIGS. 3A and 3B, at least one inner chamber 244 is disposed within the first body of high thermal conductivity material 214. The at least one inner chamber 244 may be regularly shaped as shown in FIG. 3A, or irregularly shaped as shown in FIG. 3B. The at least one inner chamber 244 is adapted to receive a second body of high thermal conductivity material 215. In an embodiment, the at least one inner chamber 244 may be formed directly as a space in the first body of high thermal conductivity material 214. In this embodiment, the at least one inner chamber 244 is filled with the second body of high thermal conductivity material 215 and is in direct contact with and completely enclosed within, but separate from, the first body of high thermal conductivity material 214. In another embodiment, the at least one inner chamber 244 may be formed from a high thermal conductivity material, such as the material selected to form the thermally conductive housing 212. In this embodiment the high thermal conductivity material forms the walls of the at least one inner chamber 244, such that the second body of high thermal conductivity material 215 is in direct contact with and completely enclosed within the walls formed from the high thermal conductivity material. That is to say, in different embodiments the second body of high thermal conductivity material 215 may be encapsulated by the at least one inner chamber 244, or the second body of high thermal conductivity material 215 may be un-encapsulated by the at least one inner chamber 244, but still located and fully contained within, while being separate from, the first body of high thermal conductivity material 214.

The thermally conductive housing 212 may be selected from any suitable material that is compatible with the selected first body of high thermal conductivity material 214. For example, aluminum would not be used as a thermally conductive housing 212 material when the first body of high thermal conductivity material 214 includes elemental gallium. The at least one wall 232 of the thermally conductive housing 212 may have a plurality of fins 222 mounted to at least a portion thereof, either outside or inside of the first body of high thermal conductivity material 214. It should be understood that the positioning, overall configuration, relative dimensions, and number of thermally conductive fins 222 are shown for exemplary purposes only.

The first body of high thermal conductivity material 214 may be formed from at least one high thermal conductivity material. The at least one high thermal conductivity material may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 200 is intended to operate and the maximum operating temperature of the heat source HS. As a non-limiting example, if the heat sink 200 is intended to operate in a room maintained at 20° C. and to cool a heat source with a maximum operating temperature of 60° C., elemental gallium having a melting point of approximately 30° C. might be selected for the first body of high thermal conductivity material 214. If the at least one high thermal conductivity material is a liquid under the intended operating conditions and the heat source is a liquid, the selected material may have a higher density than the density of the heat source material. In the alternative embodiment of FIGS. 3A and 3B, the at least one high thermal conductivity material forming the first body of high thermal conductivity material 214 is also selected such that the immiscible liquid 218 will be immiscible with any melted portion of the first body of high thermal conductivity material 214 that may form during use of the heat sink 200. Non-limiting examples of suitable high thermal conductivity materials for the first body of high thermal conductivity material 214 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

The second body of high thermal conductivity material 215 is formed from at least one solid phase change material, the at least one solid phase change material being selected such that it has a higher specific heat capacity than the specific heat capacity of the high thermal conductivity material selected for the first body of high thermal conductivity material 214 and a lower phase change temperature than the phase change temperature of the at high thermal conductivity material selected for the first body of high thermal conductivity material 214. Non-limiting examples of suitable solid phase change materials for the second body of high thermal conductivity material 215 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In use, heat generated by the heat source HS is transferred by conduction, into the first body of high thermal conductivity material 214. In the embodiments where the high thermal conductivity material is a solid phase change material, this may result in melting of at least a portion of the first body of high thermal conductivity material 214, which absorbs some of the heat from the heat source and forms a conductive melted high thermal conductivity material layer 216 within the first body of high thermal conductivity material 214 and disposed in direct contact with the heat source HS (as shown in FIGS. 3A and 3B). Therefore, the conductive melted high thermal conductivity material layer 216 is typically an at least partially liquid form of the first body of high thermal conductivity material 214. In embodiments where the high thermal conductivity material is a liquid, the first body of high thermal conductivity material 214 is immediately adjacent to the heat source HS and the second body of high thermal conductivity material 215 is un-encapsulated by the at least one inner chamber 244.

The heat stored in the first body of high thermal conductivity material 214 and the heat stored in the conductive melted high thermal conductivity material layer 216, if present, may then be transferred by conduction and convection, respectively, to the thermally conductive housing 212. Heat transferred to the thermally conductive housing 212 may then be transferred by convection into the external environment, and by convection through the fins 222, if present, thereby cooling the heat sink 200. The vibrating base 220 may propagate oscillating waves through the thermally conductive housing 212, the first body of solid high thermal conductivity material 214, the second body of high thermal conductivity material 215, and/or the thermally conductive melted high thermal conductivity material layer 216, if present, to reach the direct contact interface 228, generating active dynamic molecular motion and dilating the direct contact interface 228, and thereby increasing the rate of heat transfer from the heat source HS to the first body of high thermal conductivity material 214 and the conductive melted high thermal conductivity material layer 216, if present. Thus the heat from the heat source HS is quickly and efficiently transferred to the ambient environment.

Figure 4A:
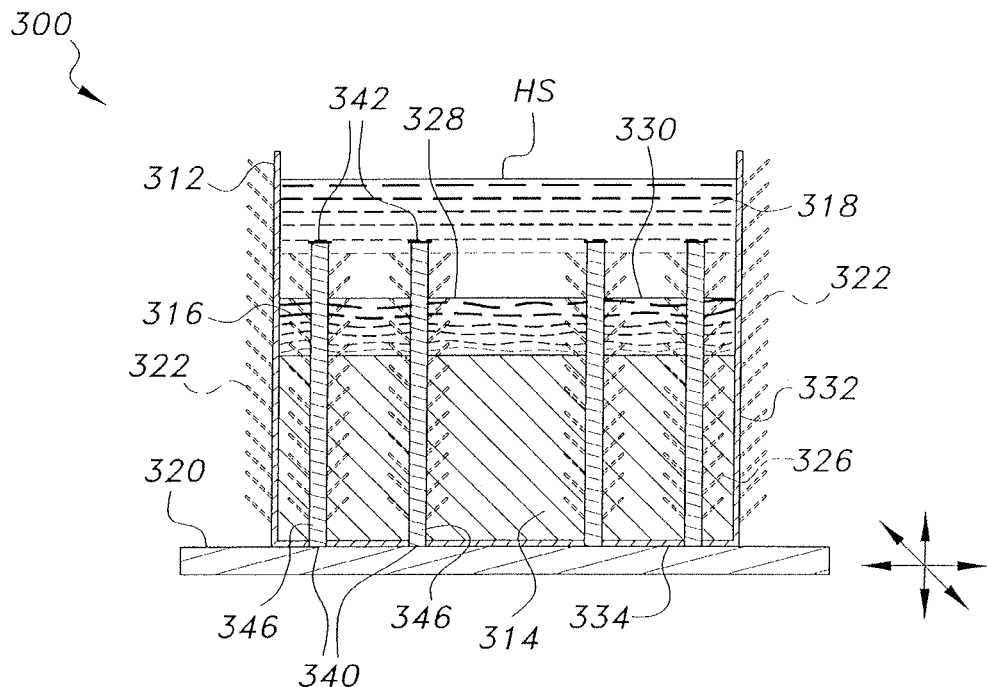
FIG. 4A is a side view in section of an alternative embodiment of a heat sink with vibration enhanced heat transfer adapted for cooling of a hot immiscible liquid heat source having at least one thermally conductive vertical stud and a conductive melted high thermal conductivity material layer.
Figure 4B:
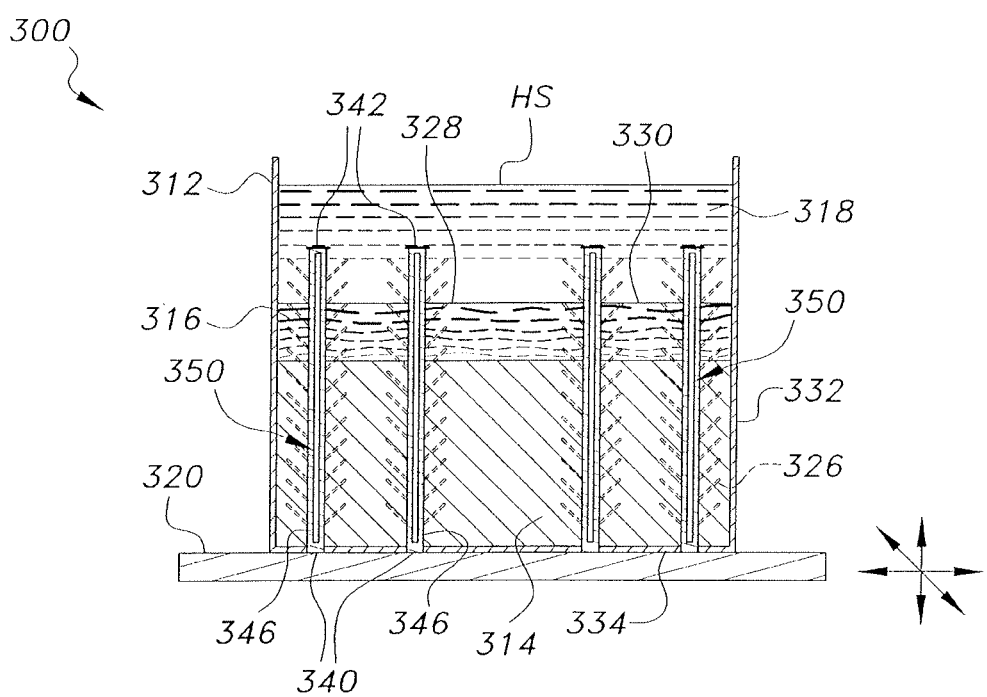
FIG. 4B is a side view in section of an alternative embodiment of a heat sink with vibration enhanced heat transfer adapted for cooling of a hot immiscible liquid heat source having at least one thermally conductive vertical stud and a conductive melted high thermal conductivity material layer, wherein the at least one thermally conductive vertical stud has at least one internal chamber containing a second body of high thermal conductivity material.

In the alternative embodiment of FIGS. 4A and 4B, the heat sink with vibration enhanced heat transfer, designated generally as 300, is again a heat sink formed from a first body of high thermal conductivity material 314 disposed within a thermally conductive housing 312 such that at least one contact face 330 of the first body of high thermal conductivity material 314 is exposed, forming a direct contact interface 328 with at least one face of at least one heat source HS that requires cooling. Similar to previous embodiments, the thermally conductive housing 312 has at least one wall 332 and at least one contact face 334, and said contact face 334 of said thermally conductive housing 312 is adapted to be in direct contact with a vibrating base 320. In this alternative embodiment, the heat source HS is an immiscible liquid 318. Similar to the previous embodiments, it should be further understood that the overall configuration and relative dimensions of the thermally conductive housing 312, the first body of high thermal conductivity material 314, and the vibrating base 320 are shown for purposes of illustration only.

As in previous embodiments, the thermally conductive housing 312 may be selected from any suitable material that is compatible with the selected first body of high thermal conductivity material 314. For example, aluminum would not be used as a thermally conductive housing 312 material when the first body of high thermal conductivity material 314 includes elemental gallium.

In the alternative embodiment of FIGS. 4A and 4B, at least one thermally conductive vertical stud 346, having a first end 340 and a second end 342, is positioned within the first body of high thermal conductivity material 314. The first end 340 of the at least one thermally conductive vertical stud 346 is coterminous with the at least one contact face 334 of the thermally conductive housing 312. Thus, the first end 340 of the at least one thermally conductive vertical stud 346 is also in direct contact with the vibrating base, 320. The second end 342 of the at least one thermally conductive vertical stud 346 is positioned within the immiscible liquid 318. The at least one thermally conductive vertical stud 346 may be made of rigid material or of a non-rigid material. The at least one thermally conductive vertical stud 346 may be composed of any thermally conductive material. In a further embodiment, the at least one thermally conductive vertical stud 346 may be composed of a material that is not a good thermal conductor. The surface of the at least one thermally conductive vertical stud 346 may be made from a malleable conducting material. Fins 326 may be attached to the surface of one or more of the thermally conductive vertical studs 346. The fins 326 may be rigid or flexible. Further, the surface of the one or more thermally conductive vertical studs 346 may bear irregularities such as grooves, bends, or other shapes to intensify heat transfer.

The first body of high thermal conductivity material 314 may be formed from at least one high thermal conductivity material. The at least one high thermal conductivity material may be liquid at intended operating conditions, or it may be a solid phase change material. The at least one high thermal conductivity material is selected such that it has a high thermal conductivity and, if the high thermal conductivity material selected is a solid phase change material, is selected such that it has a melting point between the temperature of the external environment within which the heat sink 300 is intended to operate and the maximum operating temperature of the heat source HS. As a non-limiting example, if a heat sink 300 is intended to operate in a room maintained at 20° C. and to cool a heat source with a maximum operating temperature of 60° C., elemental gallium having a melting point of approximately 30° C. might be selected for the first body of high thermal conductivity material 314. If the at least one high thermal conductivity material is a liquid under the intended operating conditions and the heat source is a liquid, the selected material may have a higher density than the density of the heat source material. In the alternative embodiment of FIG. 4, the at least one high thermal conductivity material forming the first body of high thermal conductivity material 314 is also selected such that the immiscible liquid 318 will be immiscible with any melted portion of the first body of high thermal conductivity material 314 that may form during use of the heat sink 300. Non-limiting examples of suitable high thermal conductivity materials for the first body of high thermal conductivity material 314 include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

As in previous embodiments, in use, heat generated by the heat source HS is transferred by conduction, into the first body of high thermal conductivity material 314. In the embodiments where the high thermal conductivity material is a solid phase change material, this may result in melting of at least a portion of the first body of high thermal conductivity material 314, which absorbs some of the heat from the heat source and forms a conductive melted high thermal conductivity material layer 316 within the first body of high thermal conductivity material 314 and disposed in direct contact with the heat source HS. Therefore, the conductive melted high thermal conductivity material layer 316 is typically an at least partially liquid form of the first body of high thermal conductivity material 314 (as shown in FIG. 4). In embodiments where the high thermal conductivity material is a liquid, the high thermal conductivity material 314 is immediately adjacent to the heat source (not shown).

The heat stored in the first body of high thermal conductivity material 314 and the heat stored in the conductive melted high thermal conductivity material layer 316, if present, may then be transferred by conduction and convection, respectively, to the thermally conductive housing 312. Heat transferred to the thermally conductive housing 312 may then be transferred by convection into the external environment, and by convection through the fins 322, if present, thereby cooling the heat sink 300. The vibrating base 320 may propagate oscillating waves through the thermally conductive housing 312, the first body of high thermal conductivity material 314, the at least one thermally conductive vertical stud 346, and/or the thermally conductive melted high thermal conductivity material layer 316, if present, to reach the direct contact interface 328, generating active dynamic molecular motion and dilating the direct contact interface 328, and thereby increasing the rate of heat transfer from the heat source HS to the first body of high thermal conductivity material 314 and the conductive melted high thermal conductivity material layer 316, if present.

In the alternative embodiment of FIGS. 4A and 4B, the at least one thermally conductive vertical stud 346 may by constructed of a rigid material, and thus the at least one thermally conductive vertical stud 346 may also vibrate, leading to further disturbance of the direct contact interface 328 and further enhancing the rate of heat transfer from the heat source HS to the first body of high thermal conductivity material 314 and the conductive melted high thermal conductivity material layer 316, if present. In the alternative embodiment of FIGS. 4A and 4B, the at least one thermally conductive vertical stud 346 may be made of a non-rigid material, and thus the at least one thermally conductive vertical stud 346 may move at a different rate in response to vibration than the thermally conductive housing 312. In the alternative embodiment of FIG. 4A, the at least one thermally conductive vertical stud 346 may be constructed of a high thermal conductivity material, or a low thermal conductivity material, or a non-conducting material. If more than one thermally conductive vertical stud 346 is present, each may be made of the same or different material. If the at least one thermally conductive vertical stud 346 is constructed of a high thermal conductivity material, this stud may assist in conducting heat from the surrounding first body of high thermal conductivity material 314 directly to the vibrating base 320. If the at least one thermally conductive vertical stud 346 is constructed of a low-conducting or a non-conducting material, the at least one thermally conductive vertical stud 346 will agitate the surrounding first body of high thermal conductivity material 314 in response to vibration, assisting with heat transfer. Thus the heat from the heat source HS is quickly and efficiently transferred to the ambient environment.

In the alternative embodiment of FIG. 4B, at least one internal chamber 350 is disposed within the at least one thermally conductive vertical stud 346. It should be further understood that the overall configuration and relative dimensions of the at least one inner chamber 350 are shown for illustration purposes only, and the at least one internal chamber 350 may be regularly shaped or irregularly shaped. The at least one internal chamber 350 is adapted to receive a body of phase change material. In an embodiment, the at least one internal chamber 350 may be formed directly as a space completely enclosed within the at least one thermally conductive vertical stud 346. The body of phase change material may comprise one or more phase change materials selected for changing phase at a lower temperature than the anticipated operating temperature of the heat source HS, or the phase change temperature of the first body of high thermal conductivity material 314, if the first body of high thermal conductivity material 314 is intended to operate as a phase change material. In the alternative embodiment of FIG. 4B, the at least one thermally conductive vertical stud 346 may comprise a high conductivity material, to aid in heat transfer from the heat source to the phase change material disposed within the at least one internal chamber 350. Non-limiting examples of suitable phase change materials include one or more of elemental gallium, gallium alloys, paraffin with between eighteen and thirty carbons, sodium sulfate, lauric acid, trimethylolethane, p-lattic acid, methyl palmitate, camphenilone, caprylone, heptadecanone, 1-cyclohexyloctadecane, 4-heptadecanone, 3-heptadecanone, 2-heptadecanone, 9-heptadecanone, camphene, thymol, p-dichlorobenzene, heptaudecanoic acid, beeswax, glyolic acid, glycolic acid, capric acid, eladic acid, and pentadecanoic acid.

In the alternative embodiment of FIG. 4B, heat transferred to the at least one thermally conductive vertical stud 346 may be transferred to the body of phase change material within the at least one internal chamber 350. Thus, the body of phase change material may change phase, providing an internal reservoir for heat storage and allowing the heat sink to more efficiently cool the heat source HS.

The following examples illustrate the present teachings.

Example 1

Vibration Experiments

Experiments were conducted to determine the optimal conditions for operation of a vibration enhanced heat sink. In these experiments, solid gallium was placed within a mild steel cylindrical cup and a layer of hot water (a heat source) was poured above the gallium. K-type omega thermacouples recorded temperature fluctuations from the heat source. A control test without vibration was established as a baseline, and is referred to herein as testing group A1. A B&K LDS shaker was used to provide vibrations. Vertical sinusoidal vibrations were applied to the heat sink at three levels of frequency (20, 35, and 50 Hz) and at three amplitudes (0.3, 0.5, and 0.7 mm). The amplitude values tested represent peak to peak displacement. Each test was repeated three times.

For each test group, the test was started at an initial temperature of 15° C. and hot water heated to 70° C. was poured over the solid gallium. The solid gallium's temperature measurement rapidly rose to the melting point of 30° C. Test groups at higher amplitudes or frequencies reached the melting point of the gallium faster than ones conducted at lower values of these parameters. This supports the conclusion that heat transfer rates from the heat source into the gallium were increased by application of the vibrations to the gallium.

Figure 5:
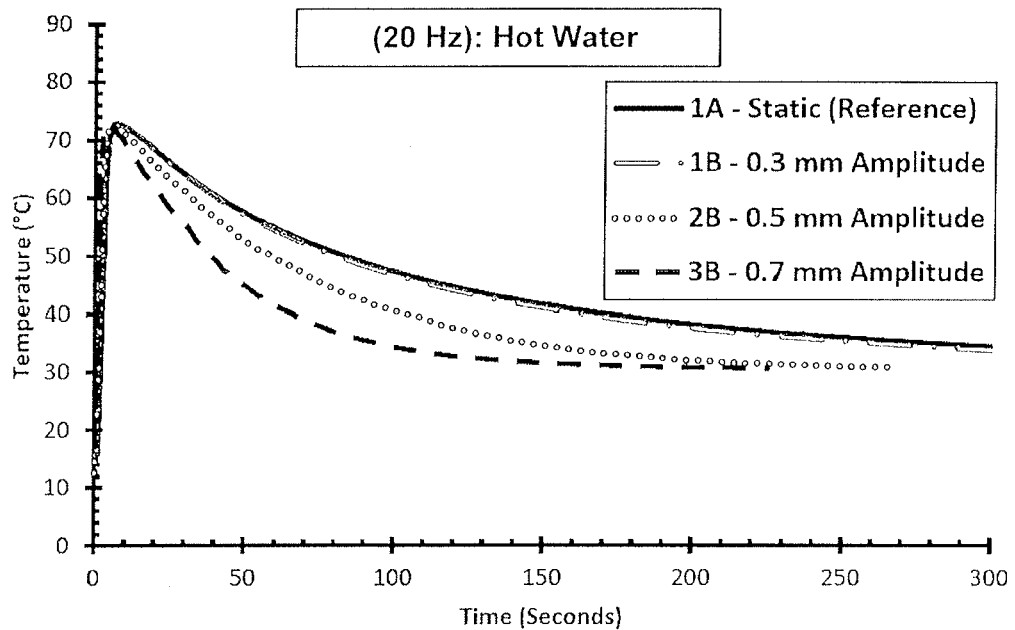
FIG. 5 is a graph representing the temperature of a heat source exposed to oscillating vibrations at 20 Hz with varying amplitudes.
Figure 6:
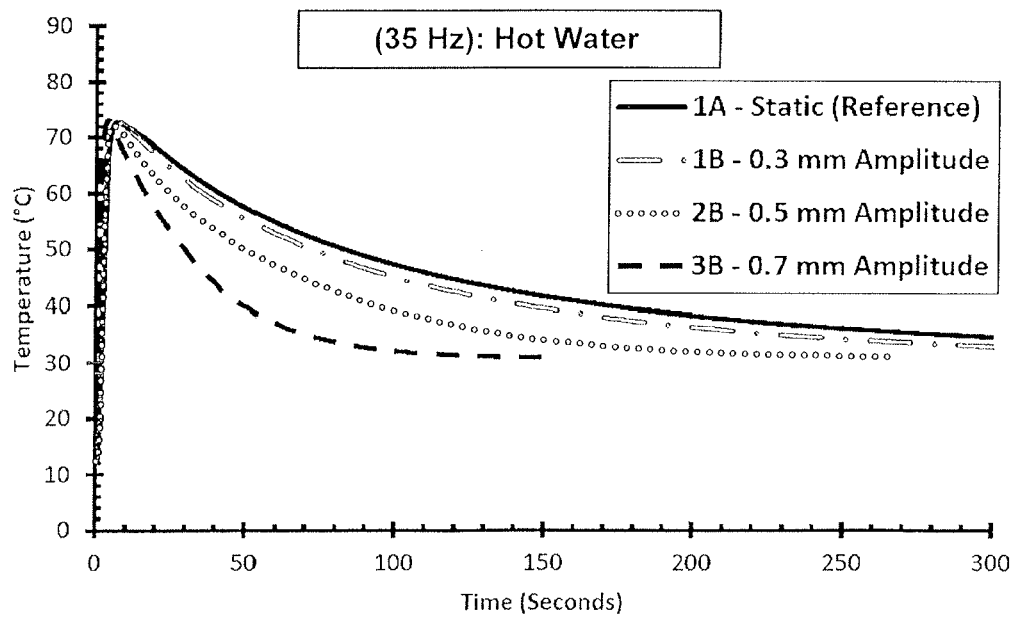
FIG. 6 is a graph representing the temperature of a heat source exposed to oscillating vibrations at 35 Hz with varying amplitudes.
Figure 7:
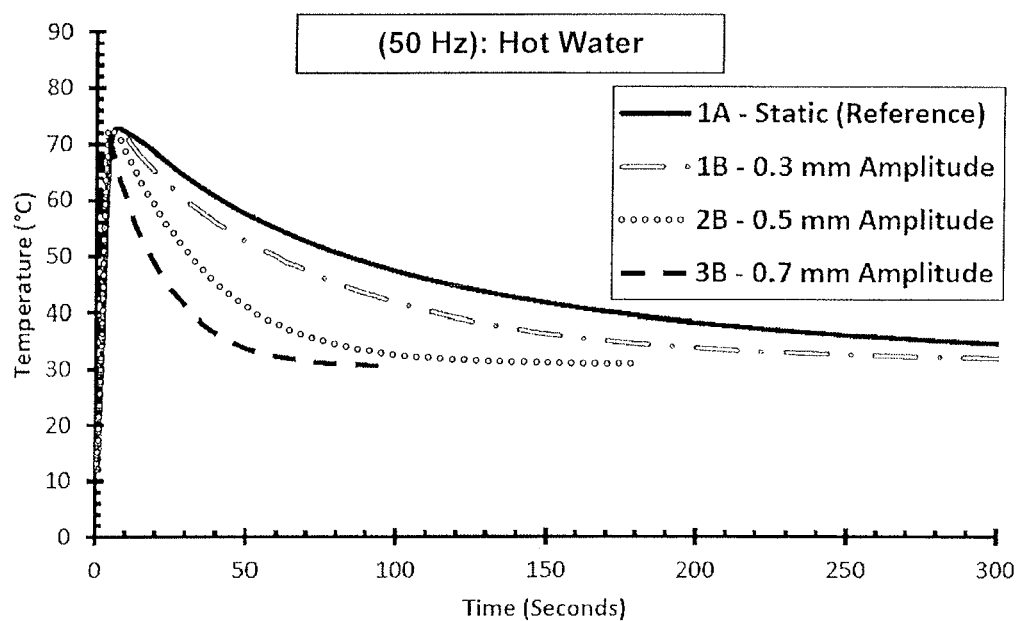
FIG. 7 is a graph representing the temperature of a heat source exposed to oscillating vibrations at 50 Hz with varying amplitudes.

As illustrated in FIGS. 5-7, the application of vibrations to the heat sink significantly increased the rate of cooling of the hot water (heat source) in a time and amplitude dependent manner. These results were used to calculate the Time Savings, or the percentage of time that it took for a particular test case to cool to a given temperature range when compared to testing group A1. These results suggest that when exposed to vibration this heat sink displays improved transfer of heat from the liquid interface region to the solid gallium and between the liquid interface region and the heat source. These results are presented in Table 1 below.

TABLE 1

|  | Time Savings % | | | |
| --- | --- | --- | --- | --- |
|  | 70-60° C. | 60-50° C. | 50-40° C. | 40-32° C. |
| 20 Hz, 0.30 mm | 7.41 | 4.76 | 5.62 | 17.61 |
| 20 Hz, 0.50 mm | 22.22 | 33.33 | 48.31 | 67.44 |
| 20 Hz, 0.70 mm | 48.15 | 59.52 | 68.54 | 75.75 |
| 35 Hz, 0.30 mm | 14.81 | 11.9 | 17.98 | 31.23 |
| 35 Hz, 0.50 mm | 40.74 | 38.1 | 49.44 | 68.11 |
| 35 Hz, 0.70 mm | 59.26 | 66.67 | 76.4 | 83.06 |
| 50 Hz, 0.30 mm | 29.63 | 26.19 | 39.33 | 40.2 |
| 50 Hz, 0.50 mm | 59.26 | 66.67 | 75.28 | 82.06 |
| 50 Hz, 0.70 mm | 74.07 | 78.57 | 83.15 | 89.7 |

Cooling Efficiency was also calculated by dividing the water temperature drop at a particular moment by the theoretical maximum temperature drop (based upon an ambient temperature of 23° C. and a starting heat source temperature of 70° C.). While the maximum cooling efficiency for all cases is approximately 84%, when vibrations are applied the time that it takes to reach this maximum cooling efficiency is reduced. Notably, this effect also varies significantly with amplitude.

Features of each of the disclosed embodiments may be used in other of the disclosed embodiments. For example, the tube of the embodiment of FIG. 2A can be used in the embodiment of FIG. 3A, and so on.

It is to be understood that the heat sinks with vibration enhanced heat transfer is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A heat sink with vibration enhanced heat transfer adapted for cooling of a liquid heat source, comprising:
   a thermally conductive housing having at least one contact face and at least one wall;
   a first body made of thermal conductive phase change material disposed within the thermally conductive housing, the first body of thermal conductive material having a first contact face disposed for direct contact with a heat source to be cooled at one end of the housing and a second contact face located at a first contact face of the housing; and
   a vibrating base, the vibrating base disposed in direct contact with an entire second contact face of the thermally conductive housing; wherein the vibrating base is configured to propagate oscillating waves through the thermally conductive housing and the second contact face of the first body of thermal conductive material to reach the first contact face disposed for direct contact with the heat source; and
   wherein the first body of thermal conductive phase change is capable of forming an at least partially liquid conductive melted thermal conductive material layer in direct contact with the liquid heat source.

2. The heat sink as recited in claim 1, further comprising a plurality of thermally conductive fins mounted on at least a portion of the at least one wall of the thermally conductive housing.

3. The heat sink as recited in claim 2, wherein the plurality of fins are constructed of a material selected from the group consisting of a first material having a first stiffness, a second material having a second stiffness less than the first stiffness, and a combination of materials having first and second stiffnesses.

4. The heat sink as recited in claim 1, further comprising at least one tube having opposed first and second ends, wherein the tube is positioned in and traverses the thermally conductive housing and one or more materials therein such that the opposed first and second ends of the at least one tube are positioned outside of the thermally conductive housing.

5. The heat sink as recited in claim 4, further comprising a plurality of thermally conductive fins mounted on at least a portion of the at least one tube.

6. The heat sink as recited in claim 5, wherein the plurality of fins are constructed of a material selected from the group consisting of a first material having a first stiffness, a second material having a second stiffness less than the first stiffness, and a combination of materials having first and second stiffnesses.

7. The heat sink as recited in claim 1, wherein the first body of thermal conductive material is a solid phase change material.

8. The heat sink as recited in claim 1, wherein the first body of thermal conductive material is a liquid.

9. The heat sink as recited in claim 8, wherein the liquid first body of thermal conductivity material has a first predetermined density and the liquid heat source has a second predetermined density lower than the first predetermined density.

10. The heat sink as recited in claim 1, further comprising a second heat source within the housing and in direct contact with the first body of thermal conductive material, wherein the second heat source is a thermally conductive material.

11. The heat sink as recited in claim 1, further comprising at least one second body made of thermal conductive material disposed within the first body of thermal conductive material, wherein the at least one second body comprises a different thermal conductive material from the first body of thermal conductive material.

12. The heat sink as recited in claim 11, wherein the second body of thermal conductive phase change material has a first specific heat capacity and the first body of thermal conductive phase change material has a second specific heat capacity lower than the first specific heat capacity.

13. The heat sink as recited in claim 1, further comprising at least one second body made of thermal conductive material disposed within the first body of thermal conductive material, wherein the at least one second body comprises a distinct entity from the first body of thermal conductive material.

14. The heat sink as recited in claim 1, wherein the vibrating base has a level of frequency between 20 Hz and 50 Hz and an amplitude within the range of 0.3 mm and 0.7 mm.

* * * * *